(12) United States Patent
Schmid

(10) Patent No.: US 8,685,864 B2
(45) Date of Patent: Apr. 1, 2014

(54) METHOD AND DEVICE FOR TREATING A SUBSTRATE SURFACE OF A SUBSTRATE

(75) Inventor: Christian Schmid, Freudenstadt (DE)

(73) Assignee: Gebr. Schmid GmbH (DE)

( * ) Notice: Subject to any disclaimer, the term of this patent is extended or adjusted under 35 U.S.C. 154(b) by 6 days.

(21) Appl. No.: 13/502,648

(22) PCT Filed: Jul. 28, 2010

(86) PCT No.: PCT/EP2010/060985
§ 371 (c)(1),
(2), (4) Date: May 11, 2012

(87) PCT Pub. No.: WO2011/047894
PCT Pub. Date: Apr. 28, 2011

(65) Prior Publication Data
US 2012/0234793 A1    Sep. 20, 2012

(30) Foreign Application Priority Data
Oct. 19, 2009   (DE) .......................... 10 2009 050 845

(51) Int. Cl.
*H01L 21/302*    (2006.01)
(52) U.S. Cl.
USPC ............. 438/747; 438/689; 438/745; 216/41; 216/42; 216/90; 216/91
(58) Field of Classification Search
None
See application file for complete search history.

(56) References Cited

U.S. PATENT DOCUMENTS

| | | | |
|---|---|---|---|
| 7,384,570 B2 * | 6/2008 | Marczak et al. ............... | 216/102 |
| 2005/0034742 A1 | 2/2005 | Saito et al. | |
| 2006/0219275 A1 | 10/2006 | Weber et al. | |
| 2008/0241378 A1 | 10/2008 | Kappler | |
| 2008/0311298 A1 | 12/2008 | Kappler | |
| 2010/0307540 A1 | 12/2010 | Ji et al. | |

FOREIGN PATENT DOCUMENTS

| | | |
|---|---|---|
| DE | 44 23 326 A1 | 1/1996 |
| JP | 2003-017464 A | 1/2003 |
| JP | 2007-335791 A | 12/2007 |

OTHER PUBLICATIONS

International Preliminary Report on Patentability issued on May 8, 2012 in connection with PCT/EP2010/060985.
German Search Report issued in connection with German Application No. 10 2009 050 845.7.
International Search Report issued in connection with PCT/EP2010/060985.

* cited by examiner

*Primary Examiner* — Lan Vinh
*Assistant Examiner* — Jiong-Ping Lu
(74) *Attorney, Agent, or Firm* — Akerman LLP

(57) ABSTRACT

In a method for the treatment of a substrate surface of a flat substrate with a process medium at the substrate underside, the process medium has a removing or etching effect on the substrate surface. The substrates are wetted with the process medium from below in a manner lying horizontally. The upwardly facing substrate top side is wetted or covered with water or a corresponding protective liquid over a large area or over the whole area as protection against the process medium acting on the substrate top side.

24 Claims, 3 Drawing Sheets

METHOD AND DEVICE FOR TREATING A SUBSTRATE SURFACE OF A SUBSTRATE

This application is a national phase of PCT/EP2010/060985, filed Jul. 28, 2010, and claims priority to DE 10 2009 050 845.7, filed Oct. 19, 2009, the entire contents of both of which are hereby incorporated by reference.

FIELD OF APPLICATION AND PRIOR ART

The invention relates to a method for treating a substrate surface in accordance with the preamble of claim 1, and to a device suitable for carrying out the method.

DE 10 2005 062 527 A1 and DE 10 2005 062 528 A1 disclose methods for treating planar substrates on one side, to be precise for treating the substrate undersides or the downwardly facing substrate sides. When this method is applied, it is possible here despite extraction by suction below the substrates, for the substrate top side to be slightly attacked by reaction gases or outgassings from the process medium, under certain circumstances also through direct contact. Moreover, depending on the transport speed of the substrates, the mixture of the process medium or the chemical and the state of the substrate surfaces, an undesired edge wraparound of the process medium can occur. As a result, the substrate top side can be attacked and also be impaired optically or, which is even worse, functionally.

OBJECT AND HOW IT IS ACHIEVED

The invention is based on the object of providing a method mentioned in the introduction and a corresponding device with which problems in the prior art can be eliminated and, in particular, a possibility is provided for preventing an upwardly facing substrate top side of the substrate from being exposed to the undesirable and harmful effect of the process medium, in particular in outgassed form.

This object is achieved by means of a method comprising the features of Claim 1 and also a device comprising the features of Claim 16. Advantageous and preferred configurations of the invention are the subject matter of the further claims and are explained in greater detail below. Some of the features below are described only for the method or only for the device. However, irrespective of this they are intended to be applicable both to the method and to the device. The wording of the claims is incorporated by express reference in the content of the description.

It is provided that the substrate surface or the substrate underside is treated with a usually liquid process medium. The process medium has a removing or etching effect on the substrate surface, for example for the polish-etching or edge insulation of a silicon substrate for a solar cell. In this case, the substrates are wetted with the process medium from below in a manner lying horizontally which can be done in various ways known from the prior art. According to the invention, the upwardly facing or directed substrate top side is wetted or covered with water or some other corresponding protective liquid over a large area or advantageously even over the whole area. This acts as protection against the process medium or outgassings therefrom acting on or reaching the substrate top side; it can therefore as it were, be kept away therefrom. The water or the protective liquid therefore forms a protective layer on the substrate top side, such that the latter cannot be damaged by the process medium. The advantage of a liquid such as water or some other protective liquid as a protective layer or protective medium is that a liquid can easily be applied and can easily be removed again and does not bring about any mechanical impairment of the substrate top side, that is to say scratching or the like. Furthermore, the water or generally the protective liquid can advantageously be chosen such that no reaction whatsoever with the substrate top side takes place, nor any other negative impairment. Finally, it is additionally possible for the water or the protective liquid to be coordinated with the choice of process medium in such a way that water or a corresponding protective liquid running down from the substrate top side can pass into the process medium and possibly indeed dilutes the latter. However, on account of the small quantity, only an insignificant and otherwise no negative impairment of the effect, generally of the etching effect, of the process medium is brought about. Even further explanations in this respect will be given below.

It is advantageously possible to apply the protective liquid to the substrate top side before the substrate or the substrate underside is wetted with the process medium. In particular, the application of the protective liquid is even effected before the substrate is moved over a tank with the process medium therein, that is to say temporally distinctly before that or on a transport path approximately half a meter or less upstream thereof. What can thereby be achieved is that protective liquid running down cannot actually pass into the tank with the process medium therein in the first place. For the customary time of a few seconds or a few minutes for which the treatment with the process medium above the tank lasts, a single application of protective liquid to the substrate top side may suffice.

In a further configuration of the invention, the protective liquid is applied to the moved substrates or the substrate top sides thereof in a continuous method.

This can advantageously be effected by means of a stationary application device in the form of spray nozzles or spray pipes, but advantageously with little pressure, for example also by means of surge pipes. A metering can easily be set for a desired quantity of liquid on the substrate top side or thickness of a liquid film.

Even though it may suffice in many cases to apply the protective liquid to the substrate top side only once, provision can advantageously be made for applying the protective liquid multiply or at time intervals to the substrate top side, or for renewing the protective film formed thereby. This can also be effected, for example, by the protective liquid being applied while the substrates run above the tank with the process medium therein. In this case, either application can be effected very precisely, such that as little protective liquid as possible passes into the tank, or a specific delimited region can be provided or the substrates are withdrawn again, although this is generally excessively complicated.

As an alternative, the protective liquid can be applied to the substrate top side only one single time, and this is in particular before the substrate is situated above the tank with the process medium therein. The protective liquid can be applied to the substrate top side in a controlled manner such that it is present only on substrate top side. This is possible by starting of the application only when a substrate is situated under an application device. In similar manner it is stopped when the substrate is still situated under the application device. Preferably the position or adjustment of an adducted substrate is detected by means of substrate sensors, and the application device is controlled depending on this. Alternatively the position of the substrates is calculated on the basis of their application, and this can be passed on to a control device of the apparatus for the application nozzles. This way it is possible for a layer of the protective liquid to be formed, which will not drool down at the edge of the substrate, so that these may be treated with the process medium.

With correspondingly designed application devices mentioned above, in one configuration of the invention, the protective liquid can be applied to the substrate top side with a two-dimensionally distributed profile. For this purpose corresponding application devices can be designed, for example as spray nozzles, such that they produce a two-dimensionally distributed spray mist or, as surge pipes, a wide water screen. This is suitable, firstly for covering the substrate top sides with the protective liquid before movement over the tank with process medium. Furthermore, easy application of protective liquid is made possible if the latter has no negative interaction with the process medium.

As an alternative to a two-dimensional distributed application of the protective liquid to the substrate top side, this can be effected with a two-dimensionally distributed profile or in punctiform. This means, therefore, that from one or a few application devices, the protective liquid is sprayed or dropped onto the substrate top side in relatively punctiform fashion and then flows. The substrate surface can thus ultimately be covered over a large area or over the whole area, in which case, given known properties of the substrate top side, the temperature and also the properties of the protective liquid, the quantity thereof can be determined relatively precisely such that only a small proportion overflows over the substrate and can pass downwards into the process medium.

In the method it can be provided that when the substrate underside is wetted or treated with the process medium, an exothermic reaction takes place with a temperature increase of at least 10° C. A relatively thick layer of protective liquid can then advantageously be applied to the substrate top side, for example with a thickness of more than 0.5 mm or more than 1 mm, up to 1.5 mm in the case of water and even thicker in the case of protective liquids having a higher viscosity. As a result, a large portion of the protective liquid can evaporate as a result of the temperature increase and a sufficiently effective protective layer can still remain.

Alternatively, a temperature increase during the treatment of the substrate underside with the process medium can be omitted. A significantly smaller layer thickness for the protective liquid on the substrate top side then suffices, for example less than 0.2 mm or even less than 0.05 mm, actually just a thin film. However, it can have an abovementioned thickness in this case, too.

In a further configuration of the invention it can be provided that during treatment the substrate underside touches a liquid level of process medium in a tank, without the substrates being immersed more deeply. They can then as it were float on the surface of the process medium. In this case, without protective liquid, there may be the risk of process medium adhering to the edges of the substrate and possibly even reaching the substrate top side with corresponding negative consequences. Alternatively, the substrate underside can be sprayed with the process medium, although here the risk is even greater that the process medium sprayed upwards will pass upwards past the outer edges of the substrates and then settle on the substrate top sides at least in the edge regions. In the case of such spraying of the substrate undersides with the process medium from below, it is even less critical if an excessively applied amount of protective liquid drips down from the substrate, since it is then not necessarily mixed with the process medium that is sprayed against the substrate underside. The protective liquid then possibly passes into a common collecting tank, that it can possibly be separated there or alternatively, by means of corresponding treatment here the process medium can be present with the desired concentration.

After the treatment of the substrates with the process medium, said substrates can be rinsed. In this case, it can be provided that the protective liquid is also rinsed or removed from the substrate top side.

Furthermore, in this case, in accordance with a further aspect of the invention such substrates which are pierced or have perforations can also be protected, as it were, during an etching process on the substrate underside, from the etching effect reaching the substrate top side. Primarily a region around the perforations is thereby jeopardised. Therefore, a substrate can be protected not only from an edge wraparound of the process medium or settling from above, but also from the process medium ascending through perforations, for example on account of capillary action.

Alongside water or pure water, an appropriate protective liquid is one having a higher viscosity. One example thereof is PEG having a viscosity with a factor of 2 to more than 3 above that of water, or for example also up to a factor of 3.8 in the case of phosphoric acid as protective liquid. The phosphoric acid can also specifically prevent a situation in which, on account of the concentration gradient, by way of example, an etching solution comprising phosphoric acid and HF, in the case of pierced substrates, is drawn upwards not only by the capillary action but also on account of the concentration gradient, as would be present in the case of water.

Other protective liquids can have an even much higher viscosity for an even further improved protective effect or layer thickness. What is achieved by means of the higher viscosity is that the protective liquid is as it were somewhat less runny and does not run as easily from the substrate top side.

Preferably several application devices are provided neighbouring each other in a direction approximately transverse to a continuous-passage path of the substrates. The substrates can preferably be by laid onto the continuous-passage path in rows one after the other and each of them pass exactly under one application device.

In the device according to the invention it is actually provided that, above a continuous-passage path for the substrates, application devices are provided, advantageously in the form of nozzles. They can be arranged either exclusively upstream of the tank with the process medium therein, above the tank or both upstream of the tank and above the tank. The application devices are advantageously designed such that they can be adapted to the size, number of substrates alongside one another and also throughput speed such that protective liquid is applied to the substrate top sides only to the desired extent and not to excess or only insignificantly to excess.

Preferably at least one application device is arranged upstream of the tank with the process medium therein, wherein especially preferably one single row of application devices is provided transverse to the continuous-passage path of the substrates. The application devices are distanced one from the other, wherein in particular their distance is at least one width of a substrate.

For providing the application devices with liquid the can be connected to a supply tank, which is situated higher than the application devices. In this way the afflux of protective liquid to the application devices with continuous pressure can be reached by gravity alone.

In an embodiment of the invention substrate sensors are provided upstream of the application devices, seen along the continuous-passage path of the substrates, for detection of a substrate being moved closer as well as for detection of a substrate moved in passing by. Preferably these are optical sensors.

These and further features emerge not only from the claims but also from the description and the drawings, wherein the individual features can in each case be realised by themselves or as a plurality in the form of subcombination in an embodiment of the invention and in other fields and can constitute advantageous and inherently protectable embodiments for which protection is claimed here. The subdivision of the application into individual sections and sub-headings do not restrict the general validity of the statements made thereunder.

BRIEF DESCRIPTION OF THE DRAWINGS

Exemplary embodiments of the invention are schematically illustrated in the drawings and are explained in greater detail below. In the drawings.

DETAILED DESCRIPTION OF THE EXEMPLARY EMBODIMENTS

Figure 1:
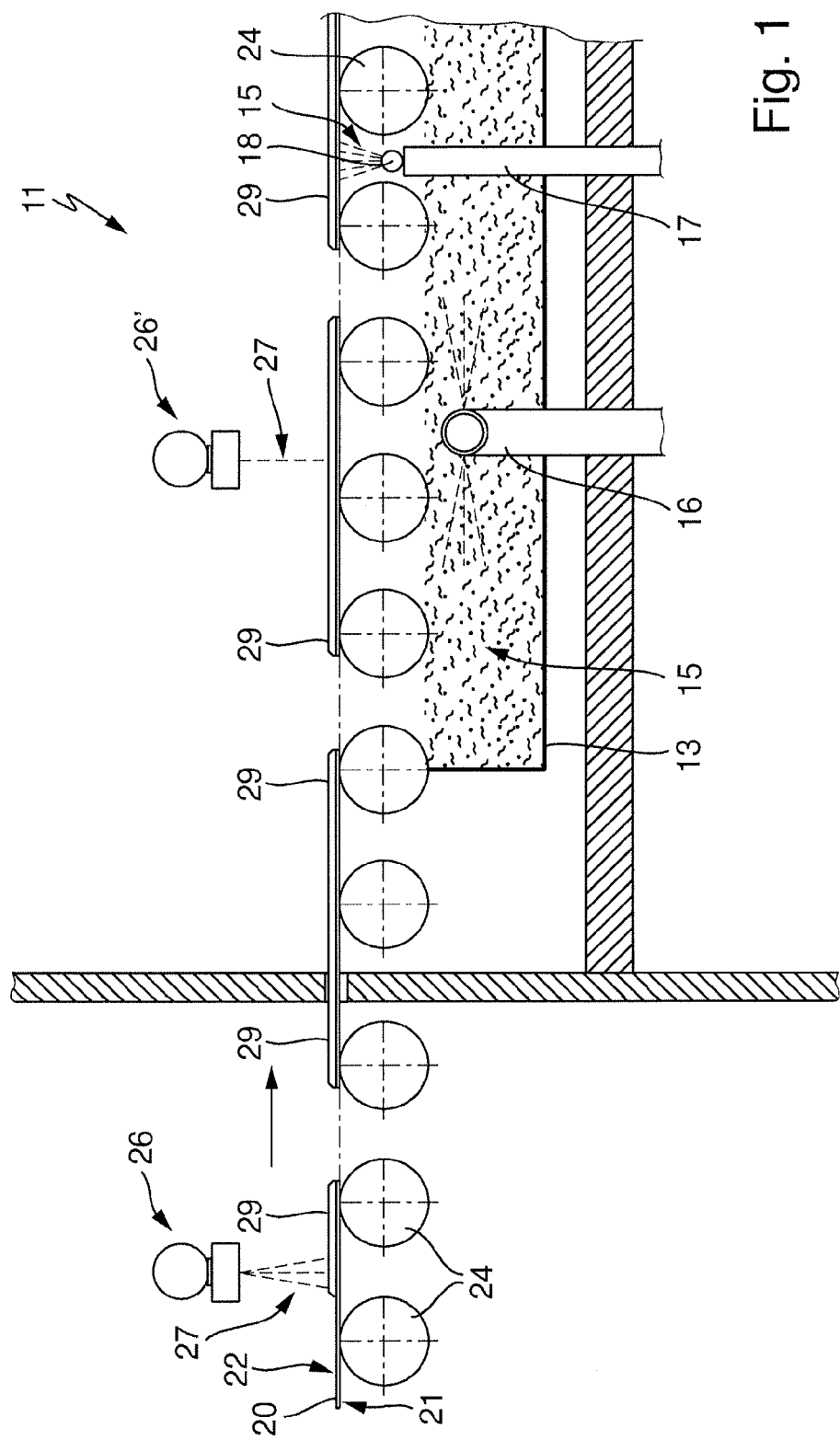
FIG. 1 shows a lateral sectional illustration of an apparatus according to the invention for the treatment of substrate undersides while water as protective film is applied to the substrate top sides.

FIG. 1 illustrates, as a device according to the invention, an apparatus 11 in lateral section comprising a tank 13, in which is situated etching solution 15 as process medium. From the left, substrates 20 with their substrate underside 21 facing downwards and a substrate top side 22 facing upwards are transported towards the right on a continuous-passage path composed of transport rollers 24. They then pass on the transport rollers 24 over the tank 13. As is known from DE 10 2005 062 527 A1 and DE 10 2005 062 528 A1 described in the introduction, in accordance with a first possibility, by means of the transport rollers 24 which reach into the etching solution 15 with their lower region, said etching solution 15 will be applied to the substrate undersides 21. Fresh or conditioned etching solution 15 is introduced into the tank 13 via a feed pipe 16. As an alternative or in addition to wetting of the substrate undersides 21 by means of the transport rollers 24, a spray pipe 17 can be provided, having an upwardly facing spray nozzle 18. Etching solution 15 can thus be sprayed onto the substrate undersides 21.

Furthermore, additionally in accordance with DE 10 2005 062 527 A1, means for suction extraction of gas that outgasses from the etching solution 15 can be provided above the surface of the etching solution and below the transport plane of the substrates.

Distinctly before the substrates 20 are introduced over the tank 13, they are sprayed with water by an application nozzle 26 arranged above them, said water forming a protective film 29 on the substrate top side 22. In this case, being sprayed with water 27 can advantageously be effected two-dimensionally or the application nozzle 26 can extend over the entire width of the substrate 20. Instead of the application nozzle, the nozzles of which can be at a distance of a few cm from one another, an abovementioned surge pipe with holes or slots can also be used. When the substrate 20 passes below the application nozzle 26, the entire substrate top side 22 is then sprayed or wetted with water 27 and a whole-area protective film 29 is thus formed. The advantage of spraying, particularly if it is effected over the whole area, in this case resides in the fact that it is then ensured that the entire substrate top side 22 is covered by the protective film 29. If the water 27 is intended to proceed merely from a single location, then it might happen that, by way of example, contaminated regions or the like on the substrate top side 22 are not wetted or covered and consequently not protected. Advantageously, three holes per substrate are provided on the application nozzle 26 or on the surge pipe.

If the etching solution 15 is then applied to the substrate underside 21 in a known manner above the tank 13, then the substrate top sides 22 are still covered with the protective film 29 and thus protected from the etching solution 15 having an effect. In order to prevent the situation in which regions of the substrate top side 22 are exposed or a protective film 29 is no longer present here, for example because the water 27 has run away or partly evaporated as a result of the high temperature during etching, water 27 can be applied again by means of a further application nozzle 26'. Firstly, this additional application nozzle 26' can be designed like the application nozzle 26 upstream of the tank 13, that is to say can produce a rather two-dimensionally distributed, relatively fine spray mist or cover an area region of the substrate top side 22.

If the application nozzle 26' is arranged, however, such that, during the etching method to be carried out, the protective film 29 possibly already becomes thin in places but is still present, then it suffices for water 27 to be resupplied in any form at all. It is thus possible to prevent a situation in which the protective film 29 as it were becomes too thin or is omitted in places. The advantage of such a punctiform application of water 27 to the substrate top side 22 in accordance with a second possibility is that it is not necessary to effect spraying, because during such spraying some of the water 27 inevitably runs past the substrate 20 into the tank 13. Dripping down at the outer edges of the substrate 20 cannot be prevented, however. Since only a very small quantity can drip down or the dripping-down of only very small quantities cannot be avoided, however, as a result hardly any dilution of the etching solution 15 will take place and, consequently, the etching effect will scarcely be impaired. Primarily if the etching solution 15 is applied on to the spray pipe 17 together with spray nozzle 18, it can be supplied in such a way that it is not diluted by water 27.

Figure 2:
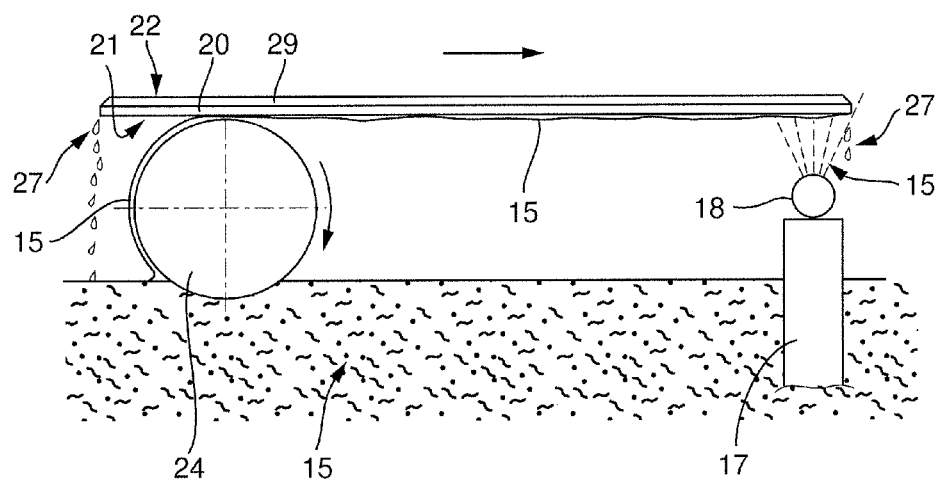
FIG. 2 shows an enlarged illustration from FIG. 1.

The enlarged illustration in FIG. 2 firstly reveals how the etching solution 15 is applied to the substrate underside 21 by means of the left-hand transport roller 24 in accordance with DE 10 2005 062 528 A1. As a result, a kind of layer comprising etching solution 15 is formed on the substrate underside 21, which brings about the etching process there. A spray pipe 17 with a spray nozzle 18 is illustrated on the right, said spray nozzle spraying etching solution 15 onto the substrate underside 21. In this case, the illustration shows on the right how some of the sprayed etching solution 15 is sprayed past the substrate 20 and can possibly fall onto a substrate top side 22 of an adjacent substrate moving or arranged alongside on the right. However, the protective film of water present on said substrate can prevent adverse impairment.

Furthermore, the illustration shows how some water 27 drips down from the substrate 20 on the left and right thereof. This water 27 passes into the etching solution 15 in the tank 13 and dilutes said etching solution somewhat. However, since the quantity of water may be very small, particularly in relation to the quantity of etching solution, this circumstance is virtually negligible or can be taken into account accordingly when the mixture of the etching solution 15 is prepared.

Furthermore, it can be seen from FIG. 2 that even an application of a relatively large amount of water 27 as a protective film 29 to the substrate top side 22 need not necessarily be harmful, since the etching solution 15 applied to the substrate underside 21 is not necessarily mixed directly with said water 27.

Possibly here the edge areas of the substrate 20 are without a protective film 29 or, if water 27 does not actually overflow over them and cover them, they are not protected. At the edges, however, the effect or damage caused by the etching solution 15 is very small or negligible, and so said edge areas do not have to be protected.

Instead of water it is possible to use some other liquid for the protective film, for example PEG or polyethylene glycol. The latter is chemically inert and neither reacts with the substrate 20 in an undesired manner nor impairs the effect of the etching solution 15. It is also possible to apply phosphoric acid as protective liquid, which does not adversely impair a substrate such as, for example, a silicon wafer for solar cells. Its higher viscosity is good primarily for the case where the substrates have the above-described perforations or pierced holes.

The exact design of the application nozzles and/or surge pipes, in particular whether and how many thereof are arranged above the tank 13 with etching solution 15, and also the exact local arrangement thereof, can be adapted to the respective etching process or treatment step. For this purpose, by way of example, it is also possible to provide movable application nozzles and/or surge pipes or use is made in each case of just a few of a large number structurally provided in principle.

Figure 3:
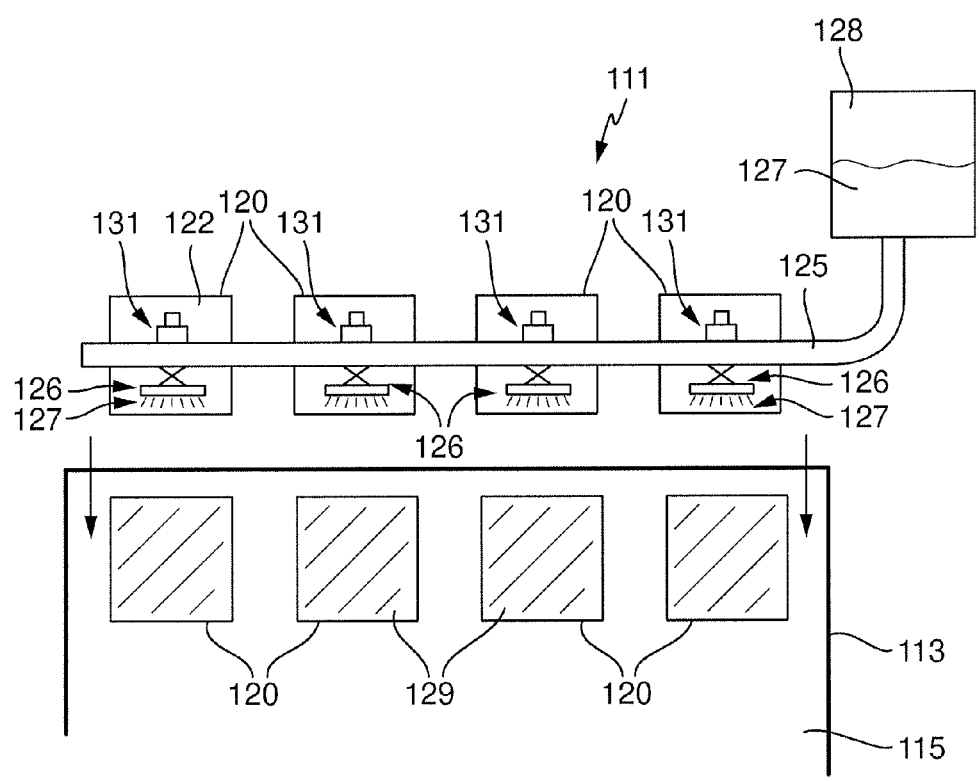
FIG. 3 shows a top view of an alternative apparatus according to the invention with less application nozzles and with substrate-sensors upstream.

A top view on an alternative apparatus 111 is illustrated in FIG. 3. Upstream of a tank 113 with edging solution 115 in it four rows of substrates 120 are running on a continuous passage path composed of transport rollers similar to the ones of FIG. 1, which are not illustrated here. There can also be less or more rows, for example six rows. Upstream of tank 113, a nozzle pipe 125 is running transverse to the continuous passage path and comprises four application nozzles 126. These are provided in each case with a magnet valve and nozzle openings, which are known to a person skilled in the art and need not be illustrated further. The width of the application nozzles 126 is less than the width of a substrate 120. The distance of the application nozzles 126 to each other is the same, but need not be.

The nozzle pipe 125 is connected to a supply tank 128 in fluid-conducting manner, in which water 127 for application onto the substrate top sides 122 is provided. By arranging the supply tank 128 at a height level above the application nozzles 126, water 127 flows automatically or on its own accord, respectively, out of it, and by opening or closing the magnet valves of application nozzles 126 the flow of water changes or the volume of water stays the same, respectively. Namely, fluctuations in pressure can be avoided, especially if the magnet valves of the application nozzles 126 are actuated with an offset to each other.

Furthermore, substrate sensors 131 are provided, which are mounted as an example in this case to the nozzle pipe 125, but can also be supported separate from it. The substrate sensors 131 detect the arrival, passing through and passing by of the substrates 120. They can be optical sensors for example, in particular also as light barrier, which detect the nearing of a front edge of a substrate 120 as well as the case that a back edge has passed by. A non-illustrated control device of apparatus 111 receives the signals of the substrate sensors 131 and can then activate the application nozzles 126 or their valves, respectively, in such a way that an application of water 127 onto the substrate top sides 122 only takes place if these are positioned beneath them. This ensures that the water 127 is actually only applied to the substrate top side 122. This is for the purpose that in this case the amount of water can be limited in a way that the two-dimensionally distributed protective film 129 is formed, but water does not flow over the lateral edges and drools down. On the one hand, the etching solution 115 in consequence is not mixed over the tank 113 with or diluted by water. On the other hand, the etching solution 115 can also act on the lateral edges of the substrate 120 as they are free. Because of the surface tension of the water the cushion or the layer of water 127, which is also illustrated in FIGS. 1 and 2, can form. Possibly also a substrate 120 with a hydrophilic substrate top side 122 can be used, which serves for even enhancing this effect. However, water 127 is applied onto the substrate top sides 122 only once.

In an alternative embodiment of the invention, which can easily be figured, the substrate sensors 131 are dispensed with and a control device of apparatus 111 can calculate from data of a delivery device for substrates connected upstream when these substrates will be positioned exactly underneath the application nozzles 126. In this way a precise and exactly targeted application of water 127 onto the substrate top sides 122 can also take place. Furthermore, significantly more application nozzles 126 and substrate sensors 131 can be provided neighbouring each other, which allow the water to be applied onto the substrate top sides also in the case of differently positioned substrates in an exact way by means of the application nozzle being most centrally positioned above them.

The invention claimed is:

1. A method for treating a substrate surface of flat silicon substrates with a process medium at the substrate underside, wherein the process medium has a removing or etching effect on the substrate surface and wherein the silicon substrates are transported one after the other over a tank containing the process medium, the method comprising the steps of:
    wetting the substrates with the process medium from below with the substrates lying horizontally; and
    wetting or covering the upwardly facing substrate top side with water or other protective liquid over a large area or over the whole area as protection against the process medium or the outgassings thereof acting on or reaching the substrate top side, the protective liquid being applied to the top side by at least one spray nozzle,
    wherein arrival of the respective substrate at a nozzle spray region and passing of the nozzle spray region by the substrate is detected, and activation of the at least one nozzle is controlled depending on this detection.

2. The method according to claim 1, wherein the protective liquid is applied multiple times with time intervals inbetween to the substrate top side.

3. The method according to claim 1, wherein the protective liquid is applied to the substrate top side one single time before the substrate is situated above a tank containing the process medium therein.

4. The method according to claim 1, wherein the protective liquid is applied to the substrate top side with a two-dimensionally distributed profile by spray nozzles designed for producing a two-dimensionally distributed spray mist.

5. The method according to claim 1, wherein when the substrate underside is wetted with the process medium, an exothermic reaction takes place with a temperature increase of at least 10° C., and the protective liquid is applied to the substrate top side in a layer having a thickness of approximately 1 mm or greater.

6. The method according to claim 1, wherein when the substrate underside is wetted with the process medium, no significant temperature increase takes place and the protective liquid is applied to the substrate top side in a layer having a thickness of approximately 50 μm to 200 μm.

7. The method according to claim 1, wherein the substrate underside is wetted with the process medium by touching a liquid level of the process medium in a tank without deeper immersion of the substrates.

8. The method according to claim 1, wherein the substrates are rinsed after the treatment with the process medium, wherein the protective liquid is also rinsed or removed from the substrate top side.

9. The method according to claim 1, wherein the protective liquid has a higher viscosity than water.

10. The method according to claim 9, wherein the protective liquid is PEG or phosphoric acid.

11. The method according to claim 1, wherein the substrates which are treated are pierced or have perforations, and wherein the protective liquid has a higher viscosity than water.

12. The method according to claim 1, wherein several application devices are arranged one next to the other in a direction approximately transverse to a continuous-passage path of the substrates, and the substrates are brought in rows one after the other onto the continuous-passage path such that each substrate passes beneath one of the application devices.

13. A method for treating substrate surfaces of flat silicon substrates with a process medium at the substrate underside, wherein the process medium has a removing or etching effect on the substrate surface and wherein the silicon substrates are transported successively over a tank containing the process medium, the method comprising the steps of:
    wetting the substrates with the process medium from below with the substrates lying horizontally; and
    wetting or covering the upwardly facing substrate top side with water or other protective liquid over a large area or over the whole area as protection against the process medium or the outgassings thereof acting on or reaching the substrate top side;
    wherein the protective liquid is applied to the substrate top side before the substrate is moved over the tank including the process medium and before the substrate underside is wetted with the process medium.

14. The method according to claim 13, wherein the protective liquid is applied to moving substrates or substrate top sides in a continuous method by stationary application devices or spray nozzles or surge pipes.

15. The method according to claim 13, wherein the protective liquid is applied to the substrate top side controlled in such a manner that it is applied exclusively to the substrate top side by starting of the application only when a substrate is situated under an application device, and by stopping application of the protective liquid when the substrate is still situated under the application device.

16. The method according to claim 13, wherein the protective liquid is applied to the substrate top side in a punctiform fashion in order to cover the substrate surface over a large area or over the whole area.

17. The method according to claim 13, wherein when the substrate underside is wetted with the process medium, an exothermic reaction takes place with a temperature increase of at least 10° C., and the protective liquid is applied to the substrate top side in a layer having a thickness of approximately 1 mm or greater.

18. The method according to claim 13, wherein when the substrate underside is wetted with the process medium, no significant temperature increase takes place and the protective liquid is applied to the substrate top side in a layer having a thickness of approximately 50 μm to 200 μm.

19. The method according to claim 13, wherein the substrate underside is wetted with the process medium by touching a liquid level of the process medium in a tank without deeper immersion of the substrates.

20. The method according to claim 13, wherein the substrates are rinsed after the treatment with the process medium, wherein the protective liquid is also rinsed or removed from the substrate top side.

21. The method according to claim 13, wherein the protective liquid has a higher viscosity than water.

22. The method according to claim 21, wherein the protective liquid is PEG or phosphoric acid.

23. The method according to claim 13, wherein the substrates which are treated are pierced or have perforations, and wherein the protective liquid has a higher viscosity than water.

24. The method according to claim 13, wherein several application devices are arranged one next to the other in a direction approximately transverse to a continuous-passage path of the substrates, and the substrates are brought in rows one after the other onto the continuous-passage path such that each substrate passes beneath one of the application devices.

* * * * *